INVENTOR.
MARTIN I. GRACE
BY Harry A. Herbert Jr. and George Fine
ATTORNEYS

INVENTOR.
MARTIN I. GRACE
BY Harry A. Herbert Jr and George Fine
ATTORNEYS

INVENTOR.
MARTIN I. GRACE
BY Harry A. Herbert Jr. and
George Fine
ATTORNEYS

INVENTOR.
MARTIN I. GRACE
BY Harry A. Herbert Jr and George Fine
ATTORNEYS

INVENTOR.
MARTIN I. GRACE
BY Harry A. Herbert Jr and George Fine
ATTORNEYS

United States Patent Office 3,533,016
Patented Oct. 6, 1970

3,533,016

MAGNETICALLY TUNABLE NEGATIVE RESISTANCE DIODE MICROWAVE OSCILLATOR

Martin I. Grace, Framingham, Mass., assignor to the United States of America as represented by the Secretary of the Air Force Filed Oct. 1, 1968, Ser. No. 764,135
Int. Cl. H03b 7/14
U.S. Cl. 331—96 8 Claims

ABSTRACT OF THE DISCLOSURE

An electronically tunable diode oscillator is provided which includes a radial mode cavity loaded by an avalanche transit-time diode and a polycrystalline yttrium iron garnet toroid. The electronic tuning is accomplished by using the magnetic resonance phenomena of the yttrium iron garnet toroid to tune the resonant frequency of the avalanche transit-time diode loaded radial-mode cavity.

BACKGROUND OF THE INVENTION

The present invention relates to an electronicaly tunable diode oscillator and more particularly to a diode oscillator utilizing an electronically variable susceptance to tune the oscillation frequency of an avalanche transit-time diode over a 3000 mHz. range.

There are many types of oscillators for providing an output in the extremely high frequency region. However, there are limitations in the tuning apparatus and range thereof. Some of the previous oscillators required mechanical tuning and/or variation of voltages. There are others that may be electronically tuned but have limitations as to frequency range and bandwidth. Generally, the oscillators and associated tuning apparatus of the prior art are not as precise nor as compact and rugged as is desired for some applications.

The present invention provides an avalanche transit-time oscillator in a varactor package surrounded by a polycrystalline yttrium iron garnet toroid in a radial mode cavity. The structure is compact, rugged and relatively simple. The magnetic resonance phenomena of the toroid is used to tune the resonant frequency of the avalanche transit-time diode loaded radial-mode cavity, thus providing an oscillator that is compact, rugged, extremely simple and in addition thereto permitting an electronic tuning range approaching 3000 mHz. at a CW output power of greater than 1 mw.

BRIEF SUMMARY OF THE INVENTION

The present invention provides an electronically tunable diode oscillator that is comprised of a radial mode cavity which is partially loaded by a polycrystalline yttrium iron garnet toroid. An avalanche transit-time diode is packaged in a microwave varactor package. The diode is located in the center of the radial mode cavity. The polycrystalline yttrium iron garnet toroid surrounds the diode and completely fills all the space to the outside wall of the cavity. The DC bias is introduced to the diode through an RF bypass capacitor. The RF energy is slot coupled to a reduced height X-band waveguide which then may be transformed by a three section quarter-wave transformer to a full height X-band waveguide. When the avalanche transit-time oscillator diode is reversed biased into conduction, microwave oscillations are obtained. The frequency of oscillation is tuned by electronically varying the DC magnetic field which is applied along the axis of the radial mode cavity.

An object of the present invention is to provide an electronically tunable diode oscillator having a wide range.

Another object of the present invention is to provide an electronically tunable oscillator by utilizing the variable permeability of a polycrystalline yttrium iron garnet toroid to tune the resonant frequency of a diode-loaded radial-mode cavity.

Yet another object of the present invention is to provide an electronically tunable oscillator using the magnetic resonance phenomena of yttrium iron garnet to tune the resonant frequency of an avalanche transit-time oscillator loaded radial mode-cavity.

The various features of novelty which characterize this invention are pointed out with particularity in the claims annexed to and forming a part of this specification. For a better understanding of the invention, however, its advantages and specific objects obtained with its use, reference should be had to the accompanying drawings and descriptive matter in which is illustrated and described a preferred embodiment of the invention.

Figures 5, 6:
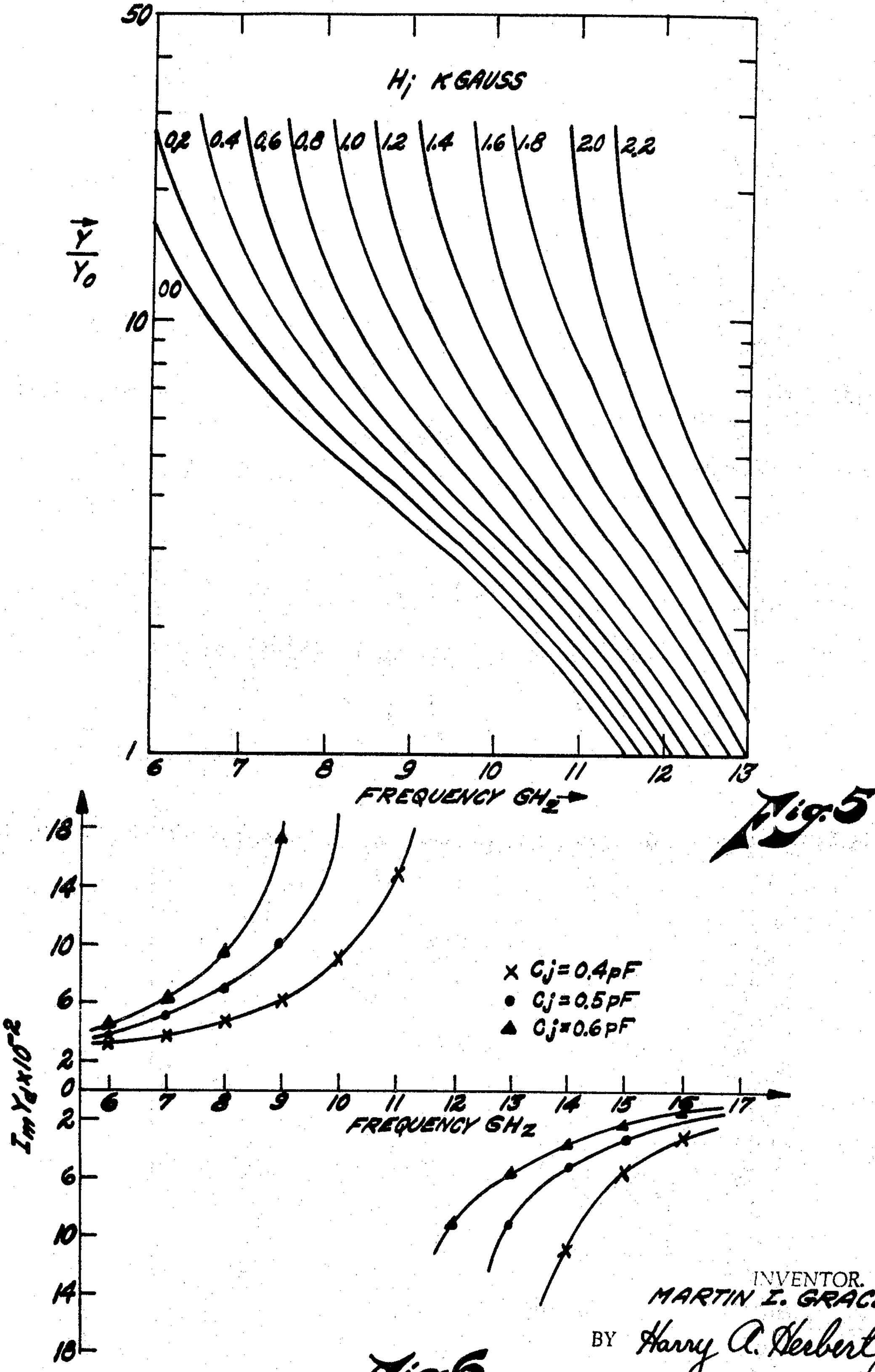
FIG. 5 is a graph of $$\vec{Y}/Y_0$$
Figures 7, 8:
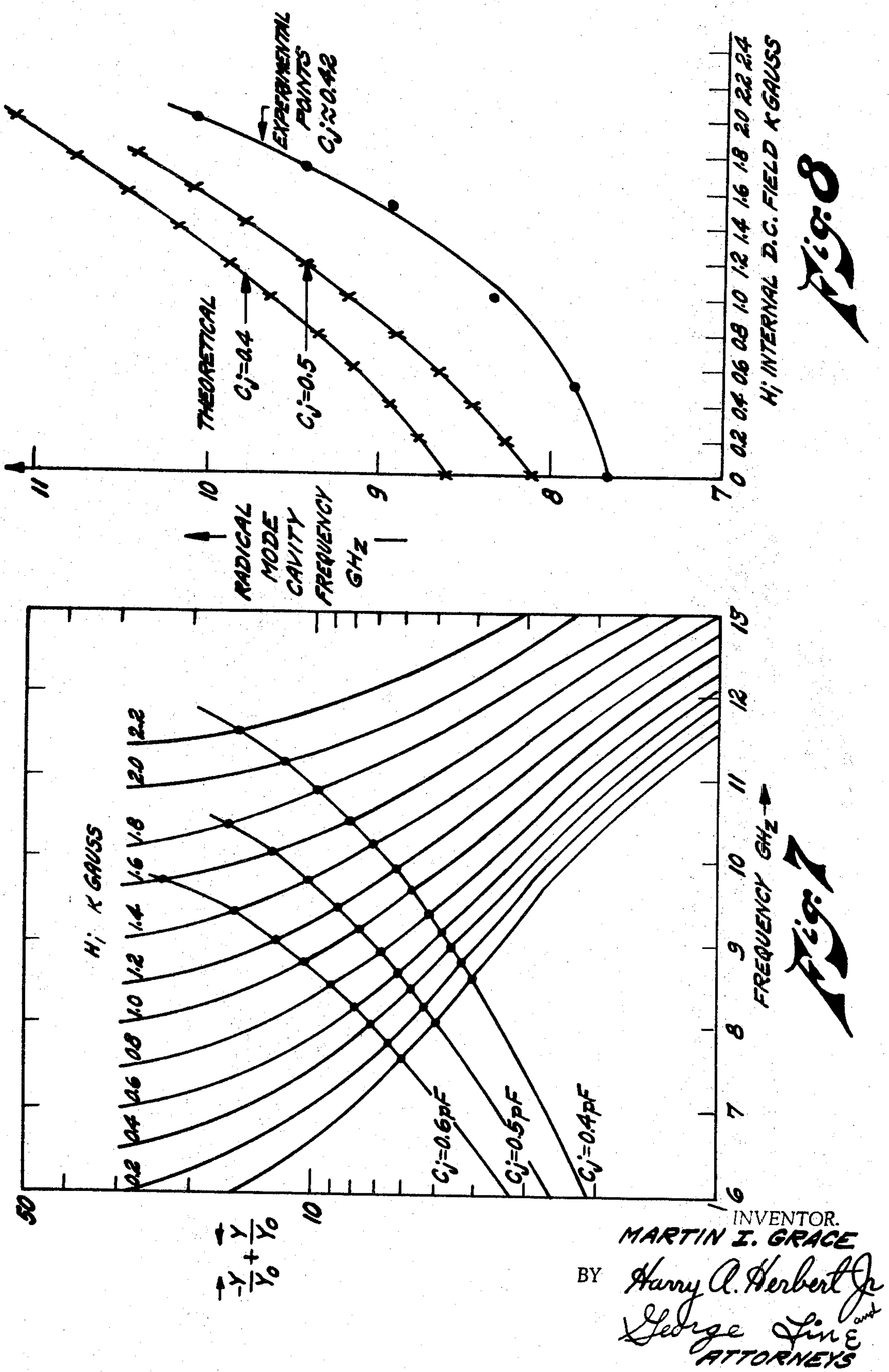

as a function of frequency for different internal magnetic fields;

FIG. 6 is a graph of the imaginary $Y_d$ as a function of frequency;

FIG. 7 is the graphical solution of $$\overleftarrow{Y}/Y_0 - \vec{Y}/Y_0 = 0$$

Figure 10:
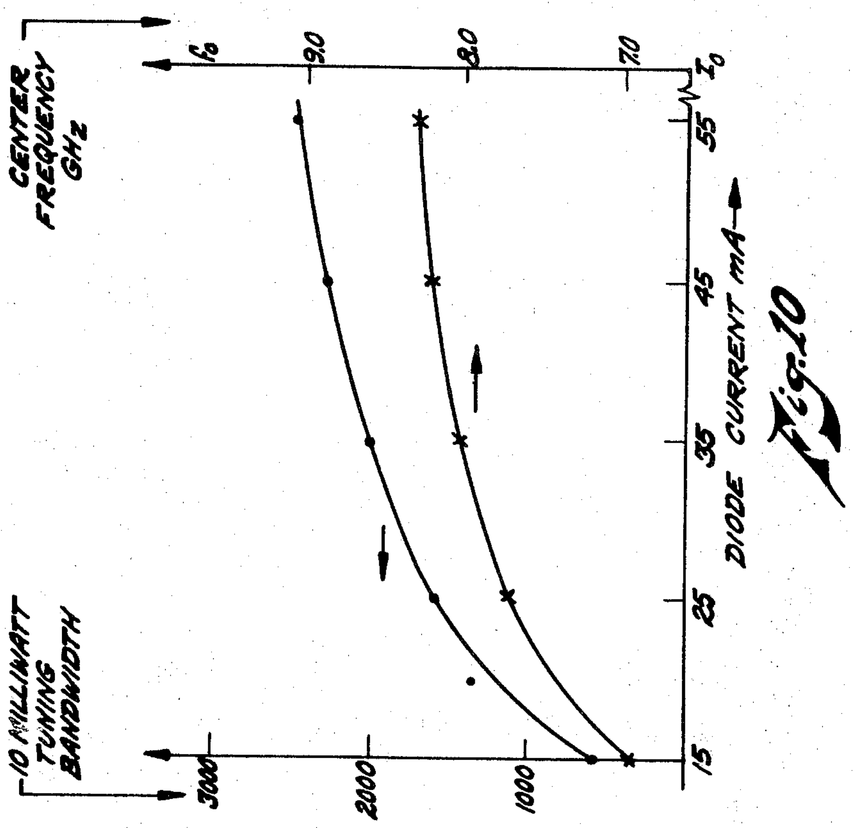
Figure 9:
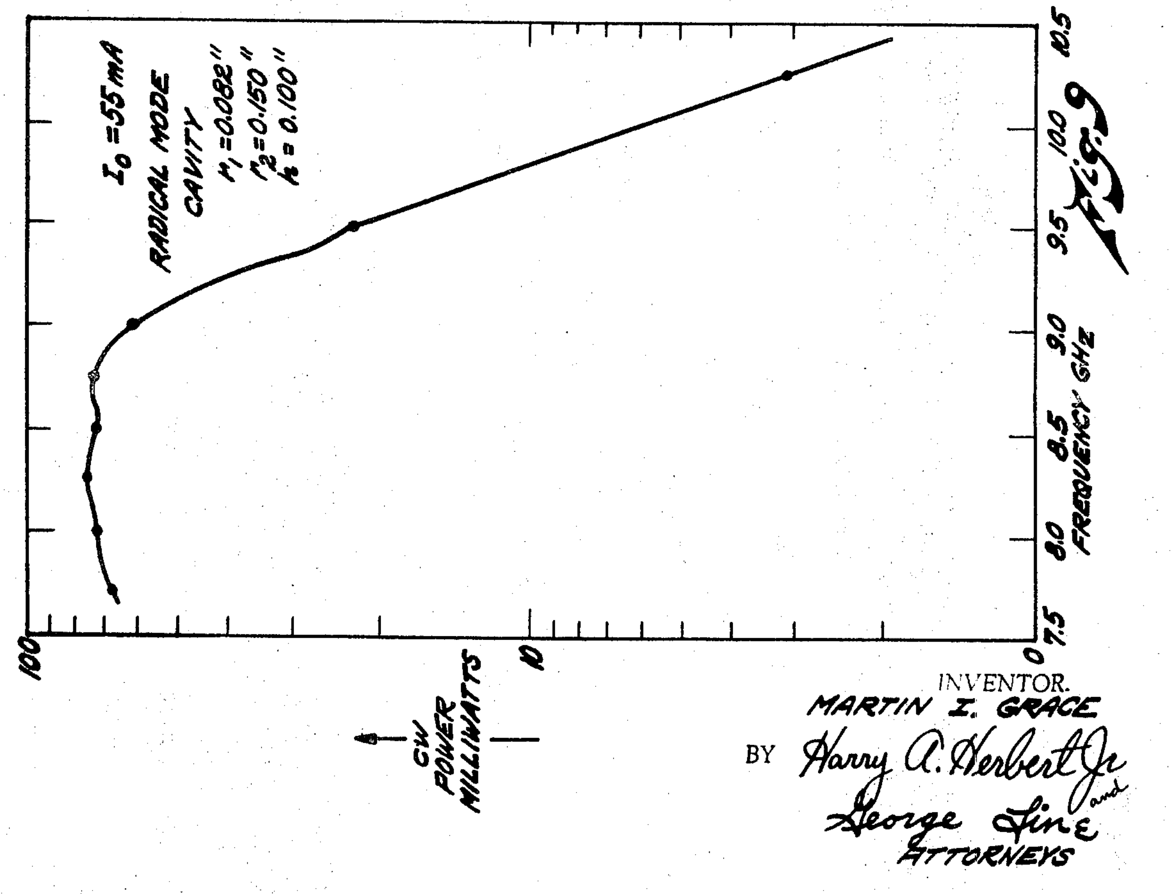

FIG. 8 is a graph of oscillation frequency vs. internal field for the diode oscillator;

FIG. 9 shows the CW output power of the diode oscillator as a function frequency; and FIG. 10 shows the center frequency and tuning range as a function of diode current.

DESCRIPTION OF THE PREFERRED EMBODIMENT

Figures 1, 2:
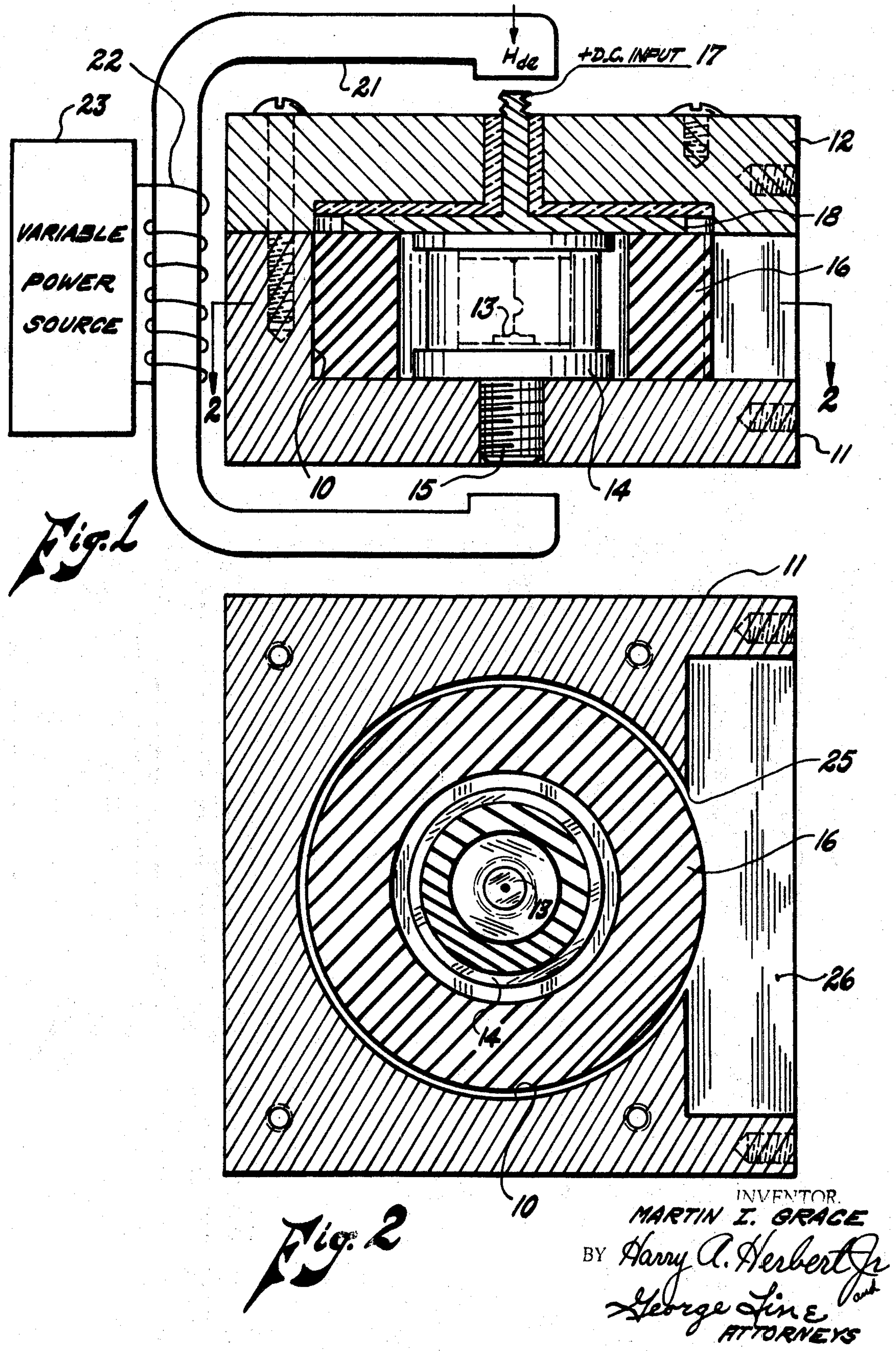
FIG. 1 shows a preferred embodiment of the invention partly in cross section.
FIG. 2 is a cross sectional view along lines 2—2 of FIG. 1.

Now referring in retail to FIG. 1, there is shown radial mode microwave cavity 10 being in the form of a cylinder of radious $\gamma$ and height $h$ such as described at pages 48–50 and 252–282, of M.I.T. Radiation Lab. Series, vol. 8, entitled "Principles of Microwave Circuits" published in 1948 by McGraw-Hill Book Company, Inc. Radial mode microwave cavity 10 is machined out of copper slab 11 and then copper slab 12 is affixed solidly to copper slab 11 by any suitable means, for example, by screws or clamps. The combination of copper slabs 11 and 12 also are utilized to provide a reduced height X-band waveguide and a coupling slot between the radial mode microwave cavity and the reduced height X-band waveguide as will be described for FIG. 2.

Prior to affixing copper slab 12 to copper slab 11, avalanche transit-time diode 13 is positioned in the center of cylindrical microwave varactor package 14. Varactor package 14 is located at the center of radial mode microwave cavity 10. Varactor package 14 has screw 15 which is threaded into a copper stud in copper slab 11 to increase the heat flow from the diode junction. Diode 13 may be a silicon p-n diode of the Misawa type. The avalanche transit-time diode may be of the type such as described by T. Misawa in "Microwave Si Avalanche Diode With Nearly-Abrupt Type Junction," in IEEE Trans. on Electron Devices, vol. ED-14, No. 9 (September 1967) pp. 580–584.

In this embodiment the diode had a junction capacitance of between 0.4 and 0.5 pf. at breakdown. The breakdown voltages varied between 45 and 75 volts. The microwave package may be such as described in the article entitled "The Packaged and Mounted Diode as a Microwave Circuit" by W. J. Getsinger in IEEE Trans. Microwave Theory and Techniques, vol. MTT-14, pp. 58–69 published February 1966.

Polycrystalline yttrium iron garnet toroid 16 is positioned in cavity 10 and surrounds varactor package 14, thus diode 13 also, and completely fills all the space to the outside wall of cavity 10. Toroid 16 was fabricated by ultrasonically cutting two concentric circles from a yttrium iron garnet slab. The linewidth was less than 50 oe. measured at 10 gHz. Copper slab 12 is affixed to copper slab 11. Copper slab 12 has passageway 19 machined therethrough. A DC bias provided by a way of line 17 to diode 10 is introduced through RF bypass capacitor 18. Line 17 is surrounded by dielectric 20. Electromagent 21 includes inductance 22. Inductance 22 is connected to variable power source 23. Electromagnet 21 and variable power source 23 are utilized to provide a variable DC magnetic field which is applied along the axis of radial mode cavity 10.

When avalanche transit-time diode 10 is reversed biased into conduction, microwave oscillations are obtained. The frequency of oscillation is tuned by electronically varying the aforesaid DC magnetic field. The RF energy provided by the oscillation of diode 13 in cavity 10 is slot couped to a reduced height X-band waveguide as described hereafter.

Now referring to FIG. 2, there is shown copper slab 11 which also has machined therein reduced height X-band waveguide 26 which is rectangular in form. Between reduced height X-band waveguide 26 and microwave radial mode cavity 10 coupling slot 25 has been provided to permit the generated RF energy from cavity 10 to be transferred for further utilization. A three section quarter-wave transformer may be utilized to interconnect the reduced height X-band waveguide to a full height X-band waveguide. The reduced height waveguide is conventional in the sense that to vary the impedance of waveguides one chnages the height, it is a standard technique as described by S. A. Schelkunoff in "Electro Magnetic Waves" published by D. Van Nostrand Co. in 1943. Coupling slot 25 provides magnetic coupling to its associated waveguide 26 such as described at pages 252–282 by C. G. Montgomery, R. M. Dicke and E. M. Purcell in "Principles of Microwave Circuits," M.I.T. Radiation Lab. Series, vol. 8, published in 1948, McGraw-Hill Book Company, Inc.

Figure 3:
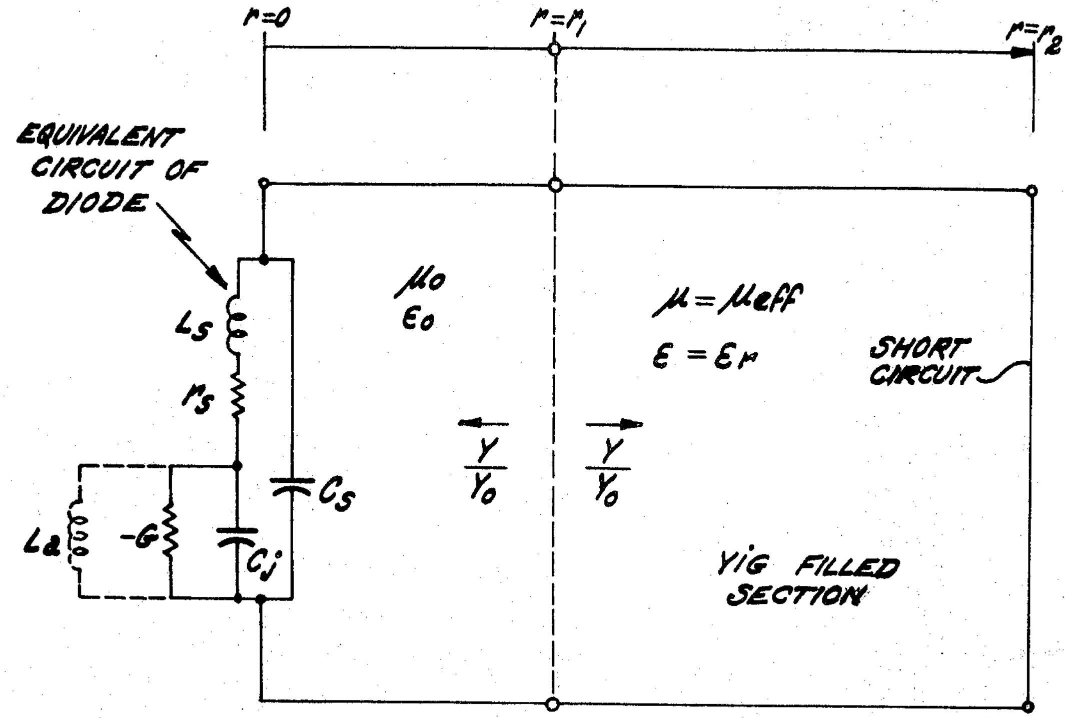
FIG. 3 is the microwave equivalent circuit of FIG. 1.

The theory of operation for the magnetic tuning of the avalanch transit-time oscillator can best be explained by treating the radial-mode cavity as a nonuniform radial transmission line that is terminated at one end by the avalanch transit-time oscillator diode and the other end by a short section of transmission line that is completely filled with yttrium iron garnet and terminated by a short circuit. The microwave equivalent circuit for the avalanche transit-time oscillator is shown in FIG. 3. The normalized admittance $$\overleftarrow{Y}/Y_0$$

looking to the left at $r=r_1$ is assumed to be that of the avalanche transit-time oscillator diode. The normailized admittance $$\overrightarrow{Y}/Y_0$$

looking right is that of a shorted section of radial transmission line that is filled with yttrium iron garnet (YIG).

The value of $$\overrightarrow{Y}/Y_0$$

is given by $$\frac{\overrightarrow{Y}}{Y_0}=-j\sqrt{\epsilon_r/\mu_{eff}}\,\frac{J_1(kr_1)N_0(kr_2)-N_1(kr_1)J_0(kr_2)}{J_0(kr_1)N_0(kr_2)-N_0(kr_1)J_0(kr_2)} \quad (1)$$

where $$k=\frac{2\pi f}{C}\sqrt{\epsilon_r\mu_{eff}} \quad (2)$$

$\epsilon_r$=Relative dielectric constant for yttrium iron garnet≈12.

C=Velocity of light in vacua.

$J_0$, $J_1$, $N_0$, $N_1$ are Bessel functions of the first and second kind.

$\mu_{eff}$=Effectively permeability for lossless ferrite is given by $$\mu_{eff}=\frac{\mu}{\mu_0}=\left[\frac{(H_i+M_s)^2-(f/\Psi)^2}{(H_i(H_i+M_s)-(f/\Psi)^2}\right]^{1/2} \quad (3)$$

where $H_i$=internal magnetic field at the yttrium iron garnet and $M_s$=saturation magnetization of the yttrium iron garnet. The derivation of the Equation 3 is well known in the prior art and is described by Lax and Button in "Microwave Ferrites and Ferrimagnetics," published by McGraw-Hill in 1962 at pages 304–306.

Figure 4:
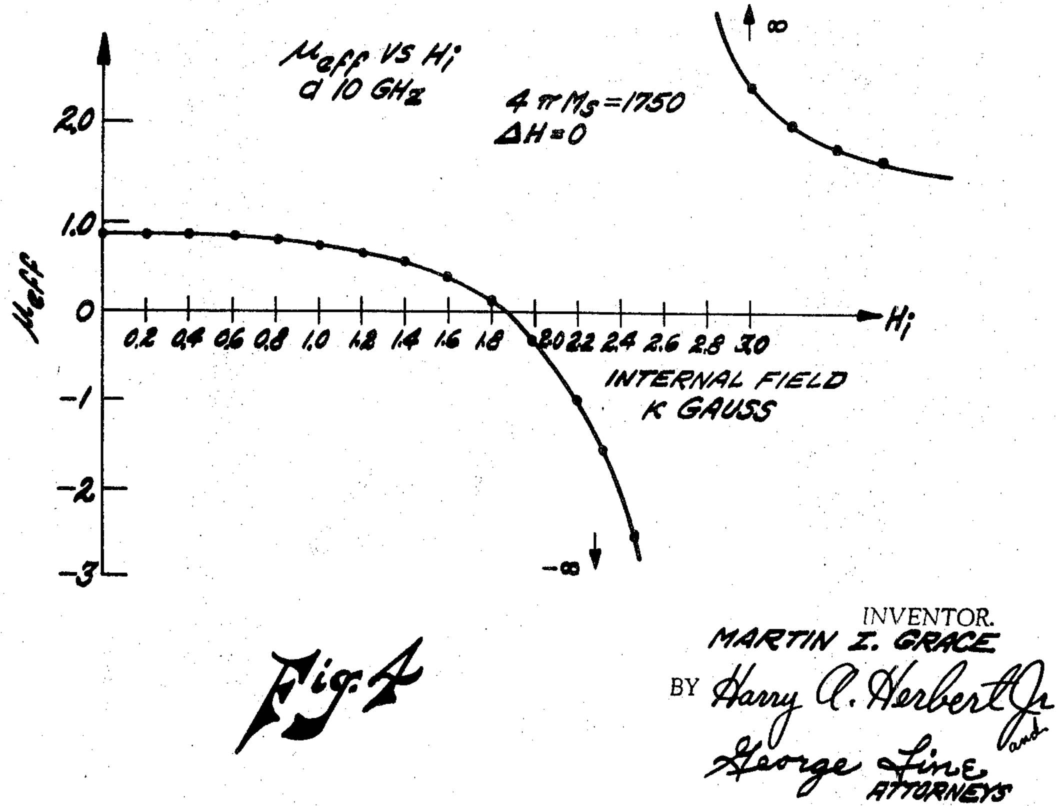
FIG. 4 is a graph of $\mu_{eff}$ as a function of internal magnetic field at 10 gHz.

A graph of $\mu_{eff}$ for a loosless ferrite as a function of internal magnetic field at a fixed frequency is shown in FIG. 4. The permeability starts at a value somewhat less than unity and decreases through zero to minus infinity and returns through positive infiinity and approaches unity as an asymtote. For all values of positive $\mu_{eff}$ the normalized admittance $$\overrightarrow{Y}/Y_0$$

increases with magneic field. FIG. 5 shows a graph of $$\overrightarrow{Y}/Y_0$$

as a function or frequency for different values of $H_i$.

The imaginary part of the normalized diode admittance $$\overleftarrow{Y}/Y_0$$

is given by $$\overleftarrow{Y}/Y_0=\sqrt{\mu_0/\epsilon_0}\,\frac{h}{2\pi r_1}\,Y_d$$

where $Y_d$ is the admittance of the microwave equivalent circuit for the diode shown in FIG. 3. The expression for the imaginary part of $Y_d$ is given by $$ImY_d=j\left\{\frac{2\pi fC_s+2\pi fC_j[1-(f/f_0)^2-L_s/C_jG^2]}{[1-(f/f_0)^2-RG]^2+(2\pi f)^2[RC_j-L_sG]^2}\right\} \quad (4)$$

where $$f_0^2=\frac{1}{(2\pi)^2L_sC_j} \quad (5)$$

$L_s$=parasitic lead inductance ≈0.4 nh $C_j$=junction capacitance ≈0.5 pf. at breakdown $C_s$=stray case capacitance ≈0.27 pf.

$R_s$=spreading resistance ≈5Ω

G=avalanche negative admittance ≈$3\times10^{-3}$ mho.

Equation 4 plotted as a function of frequency is shown in FIG. 6. The resonant frequency of the avalanche transit-time oscillator cavity as a function of magnetic field was obtained from a graphical solution of the transverse conditions:

$$\overleftarrow{Y}/Y_0-\overrightarrow{Y}/Y_0=0$$

This is illustrated in FIG. 7, which shows the graphical solution for the resonant frequency versus internal magnetic field for different diode junction capacitances. A plot of the calculated and experimentally observed frequency of operation as a function of externally applied magnetic field is shown in FIG. 8. There are several possible sources of error between the measured and calculated resonant frequency; the first source of error was that the equivalent circuit used to calculate the diode normalized impedance $$\overleftarrow{Y}/Y_0$$

is a small signal circuit and is only approximately correct for the large signal operating conditions of an oscillating avalanche diode. A second source of error was due to the assumption that a toroid can be approximated by ellipsoid of revolution in calculating the internal magnetic field. The power output versus frequency for the avalanche diode for a given DC bias current is shown in FIG. 9. A maximum output of 75 mw. at an efficiency of 2% was measured at 8.25 gHz. The shape of the curve indicates that even greater tuning range could be obtained by lowering the zero field resonant frequency of the cavity. The frequency at which maximum power was obtained and the maximum electronic tuning range observed was found to be a function of the diode current. This is illustrated in FIG. 10, which shows that both the center frequency and tuning range increase as a function of current. For the particular diode measured, the maximum current that could be used was 55 ma. before heating effects took place. At DC currents greater than 55 ma. the power output would decrease with increasing current. The diode utilized need not be limited to an avalanche transit-time diode, but any diode which exhibits a microwave negative resistance may be used.

It is noted that the internal magnetic field is related to the applied magnetic field by Kittel's equation $$H_i = H_0 - N_z 4\pi M_s$$

where $H_0$ is the externally applied magnetic field, $N_z$ is the demagnetizing factor along the direction of the applied DC magnetic field and is dependent upon the physical dimensions of the (YIG) toroid. The value of $$N_z 4\pi M_s$$

was determined experimentally from ferromagnetic resonance experiments to be about 135 g.

Thus, in accordance with the invention, large electronic tuning ranges are achieved by using the variable permeability of a polycrystalline yttrium iron garnet toroid to tune the resonant frequency of a diode-loaded radial mode cavity. It is emphasized that the ferromagnetic material need not only be limited to polycrystalline yttrium iron garnet, but any microwave ferrite which has low loss may be used. The ferromagnetic material may have a permeability or permittivity characteristic controlled by an applied electric or magnetic field.

The microwave circuit utilized for the electronically tunable avalanche transit-time oscillator is comprised of a radial mode cavity which was partially loaded by a polycrystalline yttrium iron garnet toroid and an avalanche transit-time oscillator diode. The DC bias is introduced to the diode through an rf bypass capacitor, and the microwave energy is slot-coupled to an X-band waveguide. The frequency of oscillation is electronically tuned by varying the DC magnetic field which is applied along the axis of the cavity.

It is further noted that the radial mode cavity can operate in two possible ways: (1) where the outer wall is an electric short circuit; and (2) where the outer wall is an electric open circuit. The radial mode cavity may also be coupled to a microwave transmission line by a loop or any other conventional means. The transmission devices utilized may be coaxial lines, striplines, and microstrip transmission lines.

While in accordance with the provisions of the statutes, there has been illustrated and described the best form of the invention now known, it will be apparent to those skilled in the art that changes may be made in the form of the apparatus disclosed without departing from the spirit of the invention as set forth in the appended claims, and that in some cases certain features of the invention may be used to advantage without a corresponding use of other features.

Having now described the invention, what is claimed as new and is desired to secure by Letters Patent is:

1. An electronically tunable microwave oscillator comprising a radial-mode cavity, an avalanche transit-time diode oscillator positioned in said radial-mode cavity, a polycrystalline iron garnet toroid also positioned in said radial-mode cavity and surrounding said avalanche transit-time diode, and means to vary the permeability of said polycrystalline yttrium iron garnet toroid to tune the resonant frequency of said microwave radial mode cavity.

2. An electronically tunable microwave oscillator as described in claim 1 wherein said means to vary the permeability consists of means to apply a DC magnetic field along the axis of said radial-mode cavity and means to vary the magnitude of said applied DC magnetic field.

3. An electronically tunable microwave oscillator as described in claim 1 further including means to apply a DC voltage to said transit-time diode oscillator, and means to bypass the RF energy from said DC voltage apply means.

4. An electronically tunable microwave oscillator as described in claim 1 further including a microwave waveguide connected to said radial-mode cavity and a slot to couple energy from said radial-mode cavity to said microwave waveguide.

5. An electronically tunable microwave oscillator comprising a microwave radial mode resonant cavity, a semiconductor device exhibiting negative resistance, said semiconductor device positioned in said microwave radial mode resonant cavity, a toroid exhibiting permeability as a function of an externally applied field, said toroid surrounding said semi-conductor device, and means to vary the permeability of said toroid to tune the resonant frequency of said microwave radial mode cavity.

6. An electronically tunable microwave oscillator as defined in claim 5 wherein said means to vary the permeability consists of means to apply a DC magnet field along the axis of said radial mode cavity, and means to vary the magnitude of said applied DC field.

7. An electronically tunable microwave oscillator as defined in claim 5 further including means to apply a DC voltage to said semi-conductor device, and means to bypass the RF energy from said DC voltage apply means.

8. An electronically tunable oscillator as described in claim 5 further including a microwave transmission line, and means to couple the microwave energy from said radial mode resonant cavity to said microwave transmission line.

References Cited

UNITED STATES PATENTS 3,339,152 8/1967 Will ---------------- 331—96

OTHER REFERENCES

Electronics, "Tuning Gun Diodes," Sept. 30, 1968, pp. 44–45.

Grace: "Magnetically Tunable Transit-Time Oscillator," Proceedings of the IEEE, vol. 56, April 1968, pp. 771–773.

ROY LAKE, Primary Examiner

S. H. GRIMM, Assistant Examiner

U.S. Cl. X.R.

331—107, 177; 333—83